(12) United States Patent
Palmer

(10) Patent No.: US 12,284,785 B2
(45) Date of Patent: Apr. 22, 2025

(54) ASSEMBLY AND METHOD FOR COOLING AN APPARATUS

(71) Applicant: MBDA UK LIMITED, Stevenage (GB)

(72) Inventor: Michael Andrew Palmer, Stevenage (GB)

(73) Assignee: MBDA UK LIMITED, Stevenage (GB)

( * ) Notice: Subject to any disclaimer, the term of this patent is extended or adjusted under 35 U.S.C. 154(b) by 173 days.

(21) Appl. No.: 17/800,246

(22) PCT Filed: Feb. 9, 2021

(86) PCT No.: PCT/GB2021/050283
§ 371 (c)(1),
(2) Date: Aug. 17, 2022

(87) PCT Pub. No.: WO2021/165644
PCT Pub. Date: Aug. 26, 2021

(65) Prior Publication Data
US 2023/0068459 A1 Mar. 2, 2023

(30) Foreign Application Priority Data

Feb. 18, 2020 (EP) ..................................... 20275044
Feb. 18, 2020 (GB) ..................................... 2002176

(51) Int. Cl.
*H05K 7/20* (2006.01)
*F41G 7/22* (2006.01)
*G01S 7/02* (2006.01)

(52) U.S. Cl.
CPC ..... *H05K 7/20309* (2013.01); *H05K 7/20327* (2013.01); *F41G 7/2286* (2013.01); *G01S 7/028* (2021.05)

(58) Field of Classification Search
CPC ........... H05K 7/20309; H05K 7/20327; H05K 7/20236; G01S 7/028; F41G 7/2286
(Continued)

(56) References Cited

U.S. PATENT DOCUMENTS 4,689,439 A 8/1987 Sato
10,206,307 B2 * 2/2019 Lau .......................... H05K 7/203
(Continued)

FOREIGN PATENT DOCUMENTS

DE 10052856 A1 4/2002
DE 102018001040 A1 8/2019
(Continued)

OTHER PUBLICATIONS

International Search Report and Written Opinion dated May 11, 2021 issued in PCT/GB2021/050283.
(Continued)

*Primary Examiner* — Tho V Duong
(74) *Attorney, Agent, or Firm* — Scully, Scott, Murphy & Presser, P.C.

(57) ABSTRACT

The present disclosure comprises an evaporative cooling assembly (200) for cooling an apparatus (220), and a method for cooling an apparatus (220). The evaporative cooling assembly comprises a refrigerant tank (202), the refrigerant tank (202) containing refrigerant (204). The apparatus also comprises a first evaporator (210) configured to be positioned proximal to the apparatus (220), and a second evaporator (216) positioned to cool the refrigerant tank (202). Each of the first evaporator (210) and the second evaporator (216) are in fluid communication with the refrigerant tank (202), and the second evaporator (216) is positioned downstream of the first evaporator (210). The method for cooling a heated apparatus (220) comprises passing a refrigerant (204) from a refrigerant tank (202) to a first evaporator
(Continued)

(210), which is located proximal to the apparatus (220). At least part of the refrigerant is evaporated, and then passed to a second evaporator (216), which is positioned to cool the refrigerant tank (202).

14 Claims, 2 Drawing Sheets

(58) Field of Classification Search
USPC .................................................... 165/104.31
See application file for complete search history.

(56) References Cited

U.S. PATENT DOCUMENTS

| | | | |
|---|---|---|---|
| 2007/0144183 A1 | 6/2007 | Sakajo | |
| 2015/0060009 A1* | 3/2015 | Shelnutt | H05K 7/20809 165/11.1 |
| 2016/0157382 A1* | 6/2016 | Habert | F25B 33/00 361/700 |
| 2018/0020570 A1* | 1/2018 | Fujiwara | H05K 7/20318 |
| 2021/0079814 A1* | 3/2021 | Jansen | F25D 29/001 |

FOREIGN PATENT DOCUMENTS

| | | |
|---|---|---|
| EP | 0744576 A2 | 11/1996 |
| EP | 3147600 A1 | 3/2017 |
| GB | 1160245 A | 8/1969 |
| WO | 2018213806 A1 | 11/2018 |

OTHER PUBLICATIONS

Extended EP Search Report dated Sep. 16, 2020 issued in EP 20275044.4.
GB Search Report dated Aug. 12, 2020 issued in GB 2002176.2.
International Preliminary Report on Patentability and Written Opinion dated Sep. 1, 2022 issued in PCT/GB2021/050283.

* cited by examiner

ASSEMBLY AND METHOD FOR COOLING AN APPARATUS

TECHNICAL FIELD

The present disclosure concerns an evaporative cooling assembly and a method of cooling an apparatus. More particularly, but not exclusively, the present disclosure concerns an evaporative cooling assembly that comprises a first and a second evaporator.

BACKGROUND

An evaporative cooling assembly 100 of the prior art (FIG. 1) is housed within a housing 10. Assembly 100 comprises a refrigerant tank 102, an evaporator 110, and a vent 112. The refrigerant tank 102 is in fluid communication, via a valve 106, with the evaporator 110, which is located proximal to the apparatus 120 that is to be cooled. The evaporator 110 is in fluid communication with a vent 112 through which gases can be expelled to the atmosphere. When an apparatus 120 requires cooling, the valve 106 is opened to allow refrigerant 104 to flow out of refrigerant tank 102 through a restrictor 108, through a first conduit 109, and into evaporator 110. Refrigerant 104 is initially in the saturated condition in refrigerant tank 102, with the bulk of the refrigerant in the liquid phase. Refrigerant 104 is under pressure in refrigerant tank 102 under most conditions, and it is this pressure that causes refrigerant 104 to leave refrigerant tank 102 when valve 106 is opened in response to a demand for cooling.

Once in evaporator 110, refrigerant 104 at least partially boils, causing cooling of apparatus 120; in this manner, apparatus 120 is rapidly cooled and its temperature is brought close to the local boiling point of refrigerant 104. The vapour (or wet vapour if only partial boiling has taken place) then leaves evaporator 110 and exits assembly 100 and housing 10 and is expelled to the atmosphere via vent 112.

One of the problems associated with the system of the prior art is that when the temperature of the apparatus is relatively high, a relatively high initial cooling rate is required. The prior art system can compensate a little for this, as the pressure in the refrigerant tank will be higher at higher temperatures and will therefore increase the mass flow rate of refrigerant out of the refrigerant tank. However, if the volume of the refrigerant tank is limited by volume or weight constraints, then there is a significant risk of premature exhaustion of the refrigerant and therefore loss of temperature control of the apparatus to be cooled. If a lower mass flow rate is set (via the valve or restrictor for example), then the required cooling rate may not be achieved.

Another problem associated with the system of the prior art is that, as the refrigerant in the refrigerant tank approaches depletion, the residual refrigerant in the refrigerant tank is in the vapour phase and therefore cannot contribute to any evaporative cooling.

The present disclosure seeks to mitigate the above-mentioned problems. Alternatively or additionally, the present disclosure seeks to provide an improved evaporative cooling assembly.

SUMMARY

The present disclosure provides, according to a first aspect, an evaporative cooling assembly as claimed in claim 1.

According to a second aspect of the present disclosure there is also provided a method of cooling as claimed in claim 13.

According to a third aspect of the present disclosure, there is also provided an assembly as claimed in claim 14.

It will of course be appreciated that features described in relation to one aspect of the present disclosure may be incorporated into other aspects of the present disclosure. For example, the method of the present disclosure may incorporate any of the features described with reference to the assemblies of the present disclosure and vice versa.

DESCRIPTION OF THE DRAWINGS

Embodiments of the present disclosure will now be described by way of example only with reference to the accompanying schematic drawings of which.

DETAILED DESCRIPTION

Figure 1:
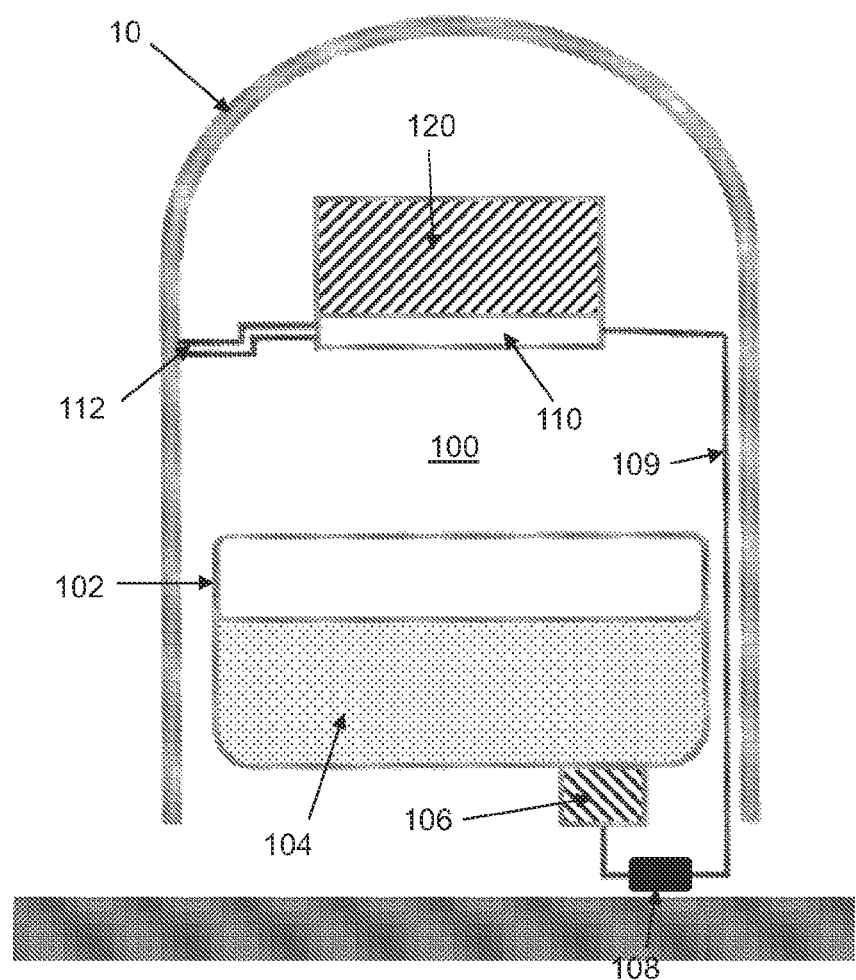
FIG. 1 shows a schematic view of an evaporative cooling assembly according to the prior art.

The present disclosure will be more fully understood and further advantages will become apparent when reference is made to the following detailed description of embodiments of the present disclosure.

As set out above, the first aspect of this disclosure provides an evaporative cooling assembly for cooling an apparatus. The evaporative cooling assembly comprises a refrigerant tank, a first evaporator and a second evaporator. The refrigerant tank contains refrigerant. The first evaporator is in fluid communication with the refrigerant tank. The second evaporator is in fluid communication with the first evaporator, is positioned downstream of the first evaporator, and is positioned to cool the refrigerant tank.

The apparatus may be heated, for example as a result of heat energy that it or other apparatus generates during operation. However, in embodiments, there may be no heating present and cooling may be required to bring the temperature of the apparatus within a specified temperature range. In use, when the evaporative cooling assembly is in the same environment as the apparatus to be cooled, a higher apparatus temperature and hence a higher cooling demand coincides with a higher temperature of the refrigerant tank. This results in a higher pressure in the refrigerant tank. This higher pressure causes a higher mass flow rate of refrigerant out of the refrigerant tank and into the first evaporator.

Initially while the apparatus is hot, most, if not all, of the refrigerant is evaporated in the first evaporator, and almost all, if not all, of the refrigerant passing from the first evaporator to the second evaporator is completely in the vapour phase. During cooling, as the temperature of the apparatus drops, less refrigerant is vaporised in the first evaporator and more refrigerant is vaporised in the second evaporator. Therefore, as the temperature of the apparatus drops, less cooling takes place at the first evaporator and hence more cooling takes place at the second evaporator. This has the effect of cooling the refrigerant tank as the temperature of the apparatus drops, which lowers the pressure within the refrigerant tank. Lower pressure within the refrigerant tank results in a lower mass flow rate of refrigerant out of the refrigerant tank and to the rest of the assembly. Therefore, linking all of the effects together, as the temperature of the apparatus drops, so the temperature of the refrigerant tank subsequently drops, thus reducing the pressure within the refrigerant tank and thus reducing the flow-rate of refrigerant out of the refrigerant tank. This is a form of automatic feedback control. Advantageously, this has the effect of automatically controlling the flow-rate of refrigerant at least partially as a function of the temperature of the apparatus to be cooled. A full tank of refrigerant is then able to last for an extended period of time, as a high flow-rate of refrigerant is not being expended on an apparatus that is already partially/mostly cooled. The presence of a second evaporator positioned to cool the refrigerant tank reduces the amount of residual refrigerant in the vapour phase, as the amount of refrigerant in the refrigerant tank approaches exhaustion. Being positioned to cool the refrigerant tank preferably includes being positioned to cool the contents of the refrigerant tank. This also increases the longevity of a single tank, as refrigerant in the vapour phase cannot contribute to evaporative cooling.

The second evaporator is positioned to cool the refrigerant tank; thus it will be in thermal communication with the refrigerant tank. The second evaporator may be outside the refrigerant tank. The second evaporator may be adjacent to the refrigerant tank. The second evaporator may be in contact with the refrigerant tank. The second evaporator may be at least partially inside the refrigerant tank. The second evaporator may be substantially fully within the refrigerant tank. Having the second evaporator at least partially inside the refrigerant tank allows the outside surface of the evaporator to be in direct contact with either the refrigerant vapour or the refrigerant liquid (or both) that is present within the refrigerant tank. This advantageously allows for quicker cooling and pressure reduction within the refrigerant tank and this reduces the lag of the feedback mechanism. In the case of contact with the refrigerant vapour within the refrigerant tank, rapid condensation may occur, which increases the remaining liquid component.

The second evaporator may be a coil. Advantageously, a coil has a large surface area to volume ratio, thus maximising heat transfer to/from the refrigerant tank.

Refrigerant is much more dense in the liquid phase and thus more refrigerant can be stored in the same volume, when stored as a liquid. The refrigerant may comprise chlorofluorocarbons, hydrofluorocarbons, fluorocarbons, hydrochlorofluorocarbons, or ammonia, or any combination of such. The refrigerant may comprise any other suitable refrigerant. The refrigerant tank may be filled at a pressure sufficient to maintain the bulk of the refrigerant in the liquid phase. The refrigerant tank may initially be substantially full of refrigerant. The refrigerant tank may contain a vapour space, when substantially full of refrigerant. Before operation, the contents of the refrigerant tank may be at the vapour pressure of the refrigerant corresponding to the temperature of the refrigerant tank. The vapour pressure varies with the type of refrigerant, and the temperature. The pressure of the refrigerant tank may be less than 3 MPa at 70° C. for example. Said pressure of the refrigerant tank may be greater than 200 kPa. Said pressure may be greater than 500 kPa, or may be greater than 1 MPa.

Substantially all of the flow of refrigerant from the refrigerant tank to the first and second evaporators may be caused by the force due to the pressure of the refrigerant within the refrigerant tank. It may be that there are no pump or active means of pressure generation fluidly connected to the assembly. Advantageously, this makes the automatic feedback control of the assembly more effective, as the pressure of the refrigerant tank is controlled as a function of the temperature of the apparatus. Having the pressure being the only force that causes the refrigerant to flow from the refrigerant tank means that apparatus is simpler, more robust, and less prone to failure. Thus, preferably, there are no other elements that cause motion of the refrigerant such as pumps, compressors, and the like. (It will be understood by the skilled person that having the only force causing the refrigerant to flow from the refrigerant tank to the first and second evaporators being the force due to the pressure of the refrigerant within the refrigerant tank does not preclude the presence of passive components, for example valves, restrictors, or expanders, or the like.)

The assembly may be scalable in size, to suit a plurality of different cooling operations. Embodiments of the present disclosure encompass a large variety of different sizes. The volumetric footprint of the assembly may be less than $5 \times 10^{-4}$ m$^3$. The volumetric footprint of the assembly may be less than $10^{-4}$ m$^3$. The person skilled in the art will appreciate that there is a physical limit to how small the assembly can become. The volumetric footprint of the assembly may allow the assembly to fit within a small space. This may be advantageous if the assembly is being used to cool an apparatus that is part of a space-limited construction. There may be no upper limit to the volumetric footprint of the assembly.

The mass of the assembly may be less than 100 kg. The mass of the assembly may be less than 50 kg, or less than 25 kg, or less than 10 kg. The mass of the assembly may allow the assembly to be incorporated in a construction that is weight limited. The mass of the assembly may be greater than 0.04 kg. The mass of the assembly may have a range between any two values chosen between 100 kg and 0.04 kg. The mass of the assembly may be between 0.04 kg and 50 kg for example. The mass of the assembly may be between 0.1 kg and 10 kg.

It may be that the apparatus only operates effectively below a threshold temperature. The cooling assembly may ensure that the apparatus is kept below the threshold temperature for effective operation.

The apparatus may be an electronic apparatus, for example electronic apparatus operating at radio frequency, i.e. RF electronics. The apparatus may for example be radar apparatus, for example an active electrically scanned radar array. The active electrically scanned array may be comprised in an air vehicle. The air vehicle may be a missile. Missiles do not typically have much spare space, nor is it desirable to have unnecessary weight. Therefore, it is particularly advantageous in this application for the cooling assembly to have a low volumetric footprint, and have a low mass.

As set out above, the second aspect of this disclosure provides a method of cooling an apparatus. The method comprises passing a refrigerant from a refrigerant tank to a first evaporator. The first evaporator is positioned to cool the apparatus. The method also comprises evaporating at least part of the refrigerant in the first evaporator. The method also comprises passing the refrigerant from the first evaporator to a second evaporator. The second evaporator is positioned to cool the refrigerant tank.

As set out above, the third aspect of this disclosure provides an assembly. The assembly comprises the evaporative cooling assembly according to the first aspect. The assembly also comprises an apparatus to be cooled.

As described above, a problem with prior art evaporative cooling assemblies is that, when both the assembly and the apparatus are hot, there is greater pressure in the refrigerant tank. This drives a higher initial mass flow-rate of refrigerant through the evaporator. This is initially beneficial, as the system automatically compensates for a higher temperature by increasing the refrigerant flow-rate. However, while the apparatus is rapidly cooled, the mass flow-rate of refrigerant remains high. This is because the refrigerant tank remains close to its original temperature (which is hot). This leads to premature depletion of refrigerant from the assembly and reduces the lifespan of a full tank of refrigerant. In addition, as the volume of refrigerant in the tank reduces, a larger proportion of refrigerant is stored in the vapour phase, which is not useful for evaporative cooling.

Figure 2:
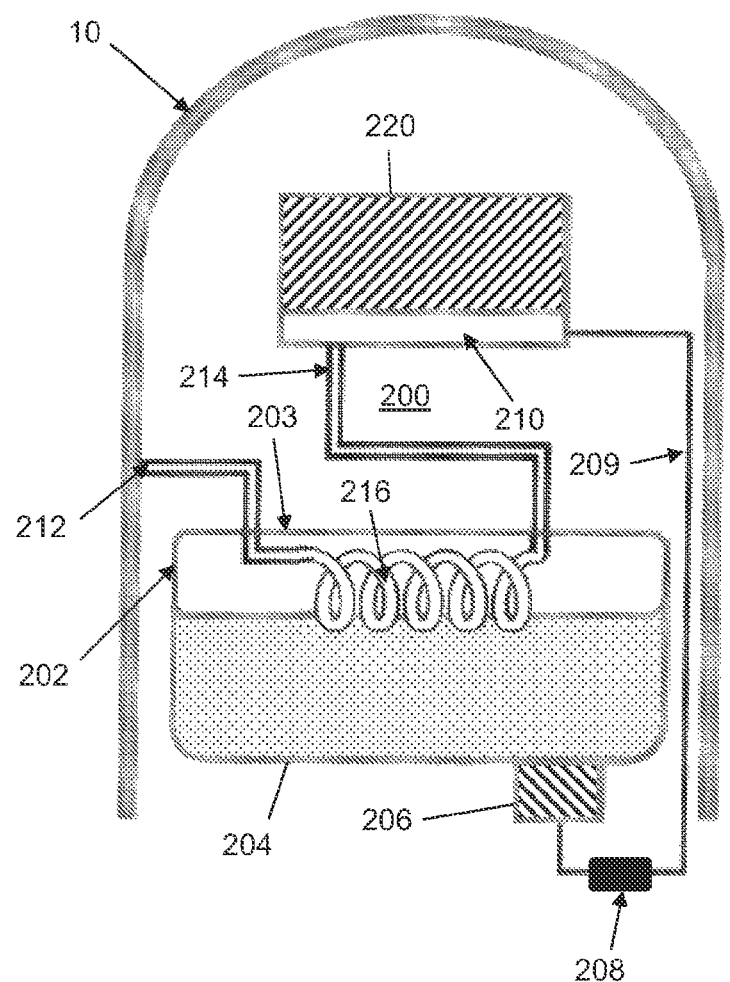
FIG. 2 shows a schematic view of an evaporative cooling assembly according to an example embodiment of the present disclosure.

FIG. 2 shows a cross-sectional view of an evaporative cooling assembly according to an embodiment of the present disclosure. In contrast with the prior art arrangement of FIG. 1, instead of refrigerant 204 leaving first evaporator 210 and exiting the assembly immediately via vent 212, the refrigerant is directed via a second conduit 214 into a second evaporator 216. Second evaporator 216 is downstream of first evaporator 210. Second evaporator 216 is in this example located inside refrigerant tank 202. Refrigerant tank 202 is sealed with refrigerant tank cap 203. Refrigerant then leaves second evaporator 216 and exits the assembly via vent 212. The pressure within refrigerant tank 202 causes refrigerant 204 to flow from refrigerant tank 202 to first and second evaporators 210, 216.

The first evaporator 210 is depicted as a rectangle in FIG. 2, and is depicted more schematically than the second evaporator 216, which is a coil. The rectangular shape of the first evaporator 210 is schematic and not necessarily representative of the actual shape of the first evaporator 210 in practice. The shape of the first evaporator 210, may be a coil, or a series of parallel channels of alternating flow directions, or may be a chamber, for example.

When in use, similar to the initial operation of FIG. 1, the apparatus 220 may increase in temperature as a by-product of its use. This may in turn increase the temperature of the environment within the housing 10, and hence the temperature of the refrigerant tank 202 (and also the contents of the refrigerant tank) may also increase. Therefore, when the apparatus 220 is heated and requires cooling, the refrigerant tank 202 may also be hot, and at higher pressure due to the increased heat. In embodiments, the tank 202 and apparatus 220 may both be at high temperature due to a high environmental temperature. In response to the demand for cooling, valve 206 is opened by a control system (not shown) and refrigerant flows through restrictor 208, through first conduit 209, and into first evaporator 210. First evaporator 210 is proximal to apparatus 220. Initially, all of refrigerant 204 in first evaporator 210 will be vaporised and will leave first evaporator 210 in the vapour phase. As all of refrigerant 204 leaving first evaporator 210 is in the vapour phase, there is very minimal cooling taking place in second evaporator 216. However, as apparatus 220 cools rapidly, refrigerant 204 passing through first evaporator 210 only partially boils, and a wet vapour leaves first evaporator 210. The wet vapour then passes into second evaporator 216 where more cooling takes place as the remaining liquid in the wet vapour boils. Therefore, as the temperature of refrigerant tank 202 reduces, so does the pressure, and consequently so does the mass flow rate of refrigerant 204 out of refrigerant tank 202. By including the second evaporator, the assembly is able to automatically control the flow rate of refrigerant through the evaporators in response to the temperature of the apparatus to be cooled. In addition, as the second evaporator 216 provides cooling to refrigerant tank 202, condensation on the outer surface of second evaporator 216 means that less refrigerant 204 will be in the vapour phase in refrigerant tank 202 as the supply of refrigerant 204 is depleted. This further increases the longevity of a full tank of refrigerant 204. This is in contrast with the operation of the assembly of the prior art 100. The assembly of the prior art 100 has a high initial flow rate of refrigerant 104 when the apparatus 120 is at its hottest. As the apparatus 120 rapidly cools, the flow rate of refrigerant 104 out of the refrigerant tank 102 does not reduce quickly because the refrigerant tank 102 (and its contents) are still at an elevated temperature, and so a significant quantity of refrigerant is expended without being used to perform any cooling.

The apparatus is not necessarily heated when it requires cooling, and may simply require cooling to bring its temperature down to an optimal/required level. For example, the optimal operating temperature of the apparatus may be at a temperature that is lower than the ambient temperature of the housing. The apparatus 200 may also be suitable for this form of operation. As the temperature of the apparatus reduces (below ambient temperature), less refrigerant is used to cool the apparatus and more refrigerant is used to cool the refrigerant tank and refrigerant, thus reducing the flow of refrigerant out of the refrigerant tank—in a similar feedback mechanism to when the apparatus is being cooled from an elevated temperature.

The conduit and the restrictor may be combined into a single construction. For example, the conduit and the restrictor may be a capillary. The first evaporator may be located within the apparatus to be cooled. The first evaporator may be located both proximal to, and within, the apparatus to be cooled. Alternatively, the second evaporator may be not, or may be only partially, inside the refrigerant tank. The second evaporator may for example be positioned outside but in contact with the refrigerant tank such that effective cooling of the refrigerant tank can still take place. The second evaporator may comprise a portion that is outside the refrigerant tank, and may further comprise a second portion that is inside the refrigerant tank. The second evaporator, when comprising a portion that is within the refrigerant tank, may be configured such that the portion within the refrigerant tank is at least partially submerged within the liquid refrigerant within the refrigerant tank, the refrigerant being at least partially in the liquid phase. The second evaporator is preferably substantially within the refrigerant tank. Further preferably, the second evaporator is fully within the refrigerant tank. Having the second evaporator substantially or fully within the refrigerant tank may maximise the rate of condensation of refrigerant within the refrigerant tank, and also maximise the pressure reduction of the refrigerant tank. The second evaporator may be fully submerged at the bottom of the refrigerant tank such that the second evaporator is always in contact with refrigerant within the refrigerant tank.

According to an embodiment of the present disclosure, refrigerant tank 202 may be at high pressure; for example the pressure in refrigerant tank 202 may be greater than 200 kPa. The pressure of the refrigerant may be at the saturation pressure corresponding to the temperature and chemical composition of the refrigerant. The pressure in the refrigerant tank may be greater than 500 kPa, or greater than 1 MPa. Refrigerant 204 may be at least partially liquid in refrigerant tank 202. This may be at least as a result in part of the high pressure in refrigerant tank 202. At least part of the refrigerant may be in the vapour phase. This may advantageously prevent hydraulic pressures that may cause bursting.

The evaporative cooling assembly may have a volumetric footprint of the assembly of less than $5 \times 10^{-4}$ m$^3$. Having a low volumetric footprint may enable the evaporative cooling assembly to be used in situations where cooling is required, but conventional cooling assemblies are not small enough. The evaporative cooling assembly may be used for cooling an active electrically scanned array. The active electrically scanned array may be comprised in an air vehicle. The air vehicle may be a missile. Housing 10 may be the external shell of a missile. The skilled person will readily appreciate that space is a premium within the confines of a missile, and so minimising the space that a cooling assembly takes up will be particularly advantageous for this application. Furthermore, in embodiments of the present disclosure, the mass of the assembly is less than 100 kg. The mass limit of the assembly may be specific for a particular application of the assembly. Having a reduced weight of the evaporative cooling assembly improves fuel economy of the missile. Reducing the weight may allow for a greater payload to be present for example.

Whilst the present disclosure has been described and illustrated with reference to particular embodiments, it will be appreciated by those of ordinary skill in the art that the present disclosure lends itself to many different variations not specifically illustrated herein.

The invention claimed is:

1. An evaporative cooling assembly for cooling an electronic apparatus, the evaporative cooling assembly comprising:
    a refrigerant tank, the refrigerant tank containing refrigerant;
    a first evaporator positioned to cool the electronic apparatus; and
    a second evaporator;
    wherein the first evaporator is in fluid communication with the refrigerant tank; and the second evaporator is in fluid communication with the first evaporator, is positioned downstream of the first evaporator, and is positioned to cool the refrigerant tank.

2. An evaporative cooling assembly as claimed in claim 1, wherein the second evaporator is at least partially inside the refrigerant tank.

3. An evaporative cooling assembly as claimed in claim 1, wherein the second evaporator is a coil.

4. An evaporative cooling assembly as claimed in claim 1, wherein at least part of the refrigerant is in the vapour phase when in the refrigerant tank.

5. An evaporative cooling assembly as claimed in claim 4, wherein the pressure of the refrigerant in the refrigerant tank is greater than 200 kPa.

6. An evaporative cooling assembly as claimed in claim 5, wherein the only force causing the refrigerant to flow from the refrigerant tank to the first and second evaporators is the force due to the pressure of the refrigerant within the refrigerant tank.

7. An evaporative cooling assembly as claimed in claim 1, wherein the volumetric footprint of the assembly is less than $5 \times 10^{-3}$ m$^3$.

8. An evaporative cooling assembly as claimed in claim 1, wherein the mass of the assembly is between 0.04 kg and 100 kg.

9. An evaporative cooling assembly as claimed in claim 1, wherein the electronic apparatus is an active electrically scanned radar array.

10. An evaporative cooling assembly as claimed in claim 1, wherein the electronic apparatus is comprised in an air vehicle.

11. An evaporative cooling assembly as claimed in claim 10, wherein the air vehicle is a missile.

12. A method of cooling an electronic apparatus, the method comprising:
    passing a refrigerant from a refrigerant tank to a first evaporator, the first evaporator being positioned to cool the electronic apparatus;
    evaporating at least part of the refrigerant in the first evaporator; and
    passing the refrigerant from the first evaporator to a second evaporator, the second evaporator being positioned to cool the refrigerant tank.

13. An assembly comprising:
    the evaporative cooling assembly of claim 1; and
    the electronic apparatus to be cooled.

14. An evaporative cooling assembly for cooling an apparatus, the evaporative cooling assembly comprising:
    a refrigerant tank, the refrigerant tank containing refrigerant;
    a first evaporator; and
    a second evaporator;
    wherein the first evaporator is in fluid communication with the refrigerant tank; and the second evaporator is in fluid communication with the first evaporator, is positioned downstream of the first evaporator, and is at least partially inside the refrigerant tank to cool said refrigerant tank.

* * * * *